(12) United States Patent
Huang et al.

(10) Patent No.: US 12,327,993 B2
(45) Date of Patent: Jun. 10, 2025

(54) SEMICONDUCTOR PACKAGE FOR A MULTI-PHASE MOTOR DRIVING CIRCUIT

(71) Applicant: Navitas Semiconductor Limited, Dublin (IE)

(72) Inventors: Chung-Kuang Huang, Irvine, CA (US); Tao Jin, Irvine, CA (US)

(73) Assignee: Navitas Semiconductor Limited, Dublin (IE)

(*) Notice: Subject to any disclaimer, the term of this patent is extended or adjusted under 35 U.S.C. 154(b) by 84 days.

(21) Appl. No.: 17/962,162

(22) Filed: Oct. 7, 2022

(65) Prior Publication Data

US 2024/0120731 A1 Apr. 11, 2024

(51) Int. Cl.
| | |
|---|---|
| G01R 31/34 | (2020.01) |
| H01L 23/00 | (2006.01) |
| H01L 23/495 | (2006.01) |
| H02H 7/08 | (2006.01) |
| H02H 7/09 | (2006.01) |
| H02K 11/33 | (2016.01) |

(52) U.S. Cl.
CPC ..... *H02H 7/0838* (2013.01); *H01L 23/49575* (2013.01); *H01L 24/48* (2013.01); *H02H 7/09* (2013.01); *H02K 11/33* (2016.01); *H01L 2224/48137* (2013.01); *H01L 2224/48175* (2013.01); *H01L 2924/1426* (2013.01)

(58) Field of Classification Search
CPC ...... H02H 7/0838; H02H 3/083; H01L 24/48; H01L 2224/48175; G01R 31/34
See application file for complete search history.

(56) References Cited

U.S. PATENT DOCUMENTS

| | | | | |
|---|---|---|---|---|
| 5,170,310 | A | * 12/1992 | Studtmann | H02H 3/083 361/65 |
| 9,620,954 | B2 | 4/2017 | Fernando et al. | |
| 10,319,671 | B2 | 6/2019 | Ahlers et al. | |
| 10,802,518 | B1 | 10/2020 | Luo et al. | |
| 2015/0214872 | A1* | 7/2015 | Kanekawa | B60L 15/04 318/400.09 |
| 2018/0323712 | A1* | 11/2018 | Traube | B64U 50/34 |
| 2019/0341870 | A1* | 11/2019 | Baurle | G01R 31/34 |

* cited by examiner

*Primary Examiner* — Cortez M Cook
(74) *Attorney, Agent, or Firm* — FisherBroyles, LLP

(57) ABSTRACT

A semiconductor package for a multi-phase motor driving circuit comprises a driving unit, a switching unit, a first bonding wire, and a second bonding wire. The driving unit comprises a first driving IC, a second driving IC and a third driving IC, configured to couple with a controller. The switching unit comprises a first pair of power switches, a second pair of power switches and a third pair of power switches, configured to couple with the first driving IC, the second driving IC and the third driving IC, respectively. The first bonding wire is coupled between a sensing pin of the first driving circuit and a connection between the driving unit and a motor driven by the driving. The second bonding wire is coupled between a fault out pin of the first driving IC, the second driving IC and the third driving IC.

19 Claims, 4 Drawing Sheets

SEMICONDUCTOR PACKAGE FOR A MULTI-PHASE MOTOR DRIVING CIRCUIT

FIELD OF THE INVENTION

The present disclosure relates to a semiconductor package and more particularly to a semiconductor package for a multi-phase motor driving circuit.

BACKGROUND OF THE INVENTION

Multi-phase motors use electricity applied to the motor in at least two different phases to rotate the motor. For example, a conventional three-phase DC motor, is typically driven by three half-bridges, and has phase coil windings that are typically configured in a star shape. Generally, the phases involve separate electrical connections and are commonly referred to as the U phase, V phase, and W phase.

When operating an electronically commutated motor using a drive circuit, various insulation faults may arise on the side of the motor. These insulation faults include insulation faults of the motor phases which may arise, for example, as a result of a defect in the motor cable or the motor winding. In addition, an insulation fault may arise at a motor neutral point as a result of insulation faults of the motor windings. In the case of an insulation fault, an electrical current can flow away to earth or the protective conductor, in which case such a fault current may constitute a risk to persons as a result of electrical shock and a fire risk. Furthermore, interruptions in motor phases may arise in motor arrangements, for example as a result of severed motor cables or burnt-out motor windings. There is a general attempt to reliably detect motor phase faults such as insulation faults or fault currents and motor phase interruptions in order to prevent further operation of a drive circuit for an electronically commutated motor, for example.

For the safety of the three-phase motor drive system, the faults (under voltage lock out, over temperature, and over currents) detection and fast response to shut down the power switches are critical to the reliability of the whole motor system. In a conventional semiconductor package 90 for a multi-phase motor driving circuit, which is controlled by a MCU 91. The conventional semiconductor package 90 comprises a first driving IC 901, a second driving IC 902, a third driving IC 903, a first pair of power switches 904, a second pair of power switches 905 and a third pair of power switches 906. As shown, the output of the multi-phase motor driving circuit is connected to the MCU 91 through an electrical line 907, such that the current and temperature can be sensed by the MCU 91. Then the MCU 91 give commands to shut down the power switches whenever the over current or over temperature happens. After detecting over current or over temperature situations, the MCU 91 will send commands to turn off the power switches. In this way, it takes longer time to turn off the power switches and has higher risks to damage the motor system.

SUMMARY OF THE INVENTION

A semiconductor package for a multi-phase motor driving circuit according to an embodiment of the present invention comprises: a driving unit, a switching unit, a first bonding wire, and a second bonding wire. The driving unit comprises a first driving IC and at least one second driving IC configured to couple with a controller. The switching unit comprises a first pair of power switches coupling to the first driving IC and at least one second pair of power switches coupling to the second driving IC. The first bonding wire is coupled between a sensing pin of the first driving circuit and a connection between the driving unit and a motor driven by the driving unit. The second bonding wire is coupled between a fault out pin of the first driving IC and the second driving IC. The driving unit, the switching unit, the first bonding wire and the second bonding wire are situated on a leadframe of the semiconductor package.

A semiconductor package for a multi-phase motor driving circuit according to an embodiment of the present invention comprises a driving unit, a switching unit, a first bonding wire, and a second bonding wire. The driving unit comprises a first driving IC, a second driving IC and a third driving IC, configured to couple with a controller. The switching unit comprises a first pair of power switches, a second pair of power switches and a third pair of power switches, configured to couple with the first driving IC, the second driving IC and the third driving IC, respectively. The first bonding wire is coupled between a sensing pin of the first driving circuit and a connection between the driving unit and a motor driven by the driving. The second bonding wire is coupled between a fault out pin of the first driving IC, the second driving IC and the third driving IC. The driving unit, the switching unit, the first bonding wire and the second bonding wire are situated on a leadframe of the semiconductor package.

DETAILED DESCRIPTION OF THE PREFERRED EMBODIMENTS

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

In the following description, numerous specific details are set forth in order to provide a thorough understanding of the present invention. It will be apparent, however, to one having ordinary skill in the art that the specific detail need not be employed to practice the present invention. Well-known methods related to the implementation have not been described in detail in order to avoid obscuring the present invention.

The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive.

Figure 2:
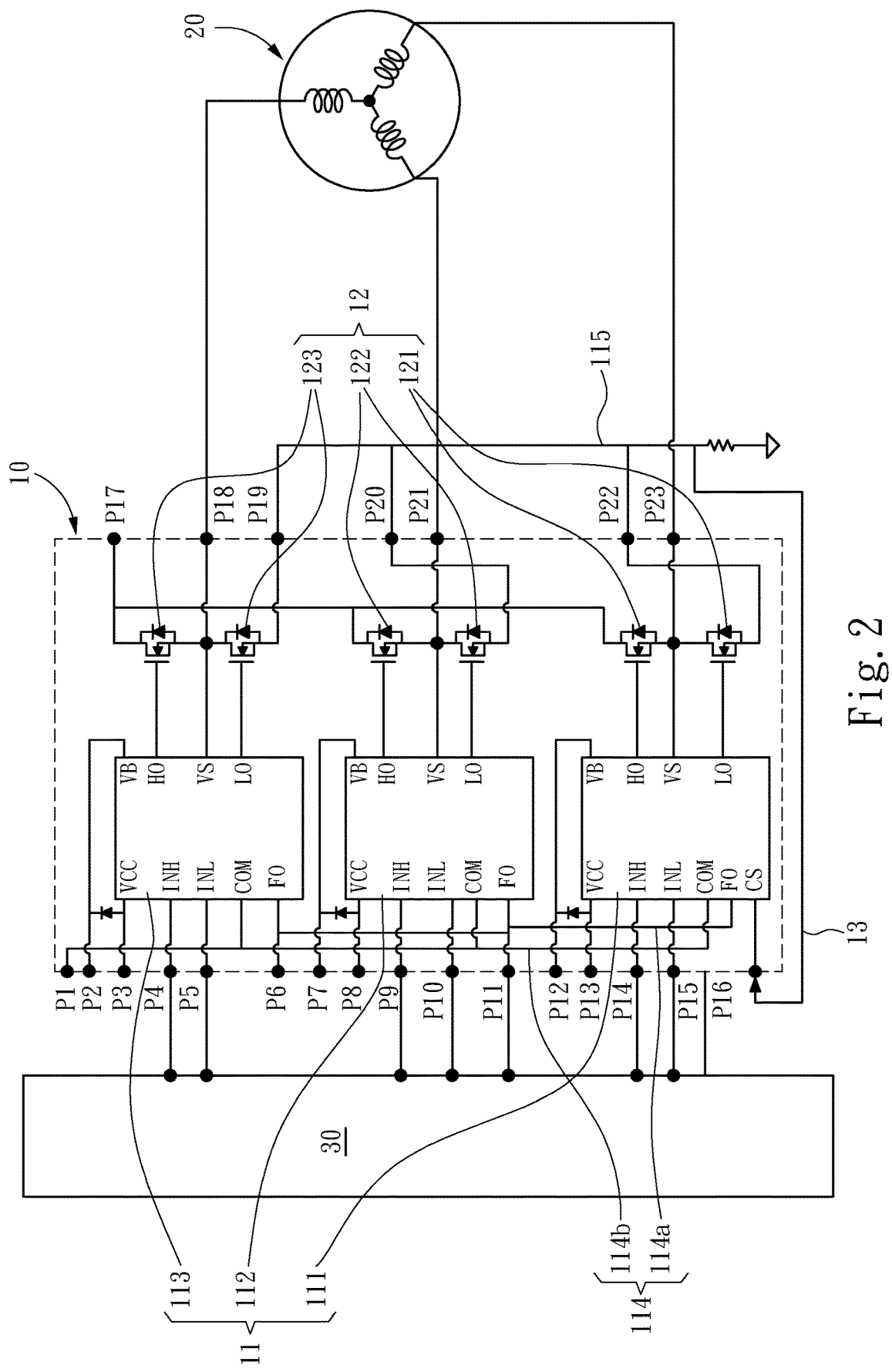
FIG. 2 illustrates a block diagram of an exemplary semiconductor package according to an embodiment of the invention.

Referring now to the figures of the drawings in detail and first, particularly to FIG. 2 thereof, there is shown a semiconductor package 10 of a multi-phase motor driving circuit which is used to drive an electronically commutated motor 20. In the example from FIG. 2, the motor is a three-phase brushless motor 20 having three motor phases U, V, W. A controller 30 is provided to control the multi-phase motor driving circuit 10. The controller 30 provides drive control signals to the multi-phase motor driving circuit 10 to control generation of motor command signals. The controller 30 may be implemented using a general-purpose microprocessor executing a computer program stored on a storage medium to perform the operations described herein. Alternatively, the controller 30 may be implemented in hardware or in a combination of hardware and software.

The semiconductor package 10 includes a driving unit 11, a switching unit 12, a first bonding wire 13 and a second bonding wire 14. The driving unit 11 includes a first driving IC 111, a second driving IC 112 and a third driving IC 113, which are coupled with the controller 30. The first bonding wire 13 and the second bonding wire 14 are situated on a leadframe of the semiconductor package 10. In the present embodiment, the semiconductor package 10 has 23 pins comprising pin P1 through P23.

The switching unit 12 includes three-phase bridge connected switching elements, which comprises a first pair of power switches 121, a second pair of power switches 122 and a third pair of power switches 123. The first pair of power switches 121, the second pair of power switches 122 and the third pair of power switches 123 are coupled with the first driving IC 111, the second driving IC 112 and the third driving IC 113, respectively.

The controller 30 supplies a predetermined drive control signal to the driving unit 11 through various kinds of terminals so as to control the first driving IC 111, the second driving IC 112 and the third driving IC 113. Each of the driving ICs produces a drive signal for driving each of the respective power switches in response to the drive control signal. Each of the power switches causes drive current to flow through the respective phase windings in response to the drive control signals, thereby rotating the rotor in the motor 20.

Each pair of power switches includes a high-side switching element and a low-side switching element, for the respective phase windings. Each of the switching element includes a transistor and a diode. The transistor is configured to perform power control and may be implemented in a field effect transistor (FET) or an insulated gate bipolar transistor (IGBT).

Each of the first driving IC 111, the second driving IC 112 and the third driving IC 113 has a power supply terminal VCC, a high-side (H) input terminal INH, a low-side (L) input terminal INL, a common terminal COM, a fault-out terminal FO, a high-voltage-side floating voltage terminal VB, a high-voltage-side floating return voltage terminal VS, an output terminal HO, an output terminal LO. Each of the first driving IC 111, the second driving IC 112 and the third driving IC 113 is capable of performing over-temperature sensing and under voltage sensing. The difference between the first driving IC 111 and the second driving IC 112/the third driving IC 113 is that the first driving IC 111 is further capable of performing over-current sensing. In addition, the first driving IC 111 further includes a current sensing terminal CS, which is not provided in the second driving IC 112 and the third driving IC 113. Whereas over-temperature, under voltage sensing and over-current may be collectively called as a fault condition.

Take the first driving IC 111 as the example, the power supply terminal VCC can be used to input a supply voltage to the first driving IC 111. The input terminals INH and INL can be used to input the drive control signal from the controller 30 to the first driving IC 111. The common terminal COM can be used to input a common ground signal to the first driving IC 111. The high-voltage-side floating voltage terminal VB can be used to input a high-voltage-side floating voltage to the first driving IC 111. The high-voltage-side floating return voltage terminal VS may be connected to an output terminal, which is a contact between the high-side switching element and the low-side switching element of the first pair of power switches 121.

The fault-out terminal FO can be used to output or input a fault-out signal from or to the first driving IC 111. Specifically, when an internal fault is detected, for example when over-temperature is detected or when a low supply voltage is input, the first driving IC 111 outputs a fault-out signal to notify the other driving ICs in order to prevent failure of components.

The first bonding wire 13 is coupled between the current sensing terminal CS of the first driving circuit 111 and a connection 115 connected to at least one output of the driving unit 11. The first bonding wire 13 and the connection 115 are configured as a feedback circuit such that the current sensing terminal CS could sense whether or not the current output from anyone of the first driving IC 111, the second driving IC 112 and the third driving IC 113 is over a threshold. In an exemplary embodiment, the current output passing through the power switches can be viewed as a detection signal transmitted through the first bonding wire.

The second bonding wire 14 is coupled between the fault out pin FO of the first driving IC 111, the second driving IC 112 and the third driving IC 113. More specifically, the second bonding wire 14 includes a first wire 114a commonly connected to the first driving IC 111, the second driving IC 112, and the third driving IC 113 and also a second wire 114b connected the first wire 114a to the controller 30.

When the fault condition occurs (at least one of over temperature, under voltage and over current), a fault signal will be generated at the fault-out terminal FO of the driving IC. So, the remaining driving ICs will detect the fault signal and be aware of the fault condition.

In an aspect, the first driving IC 111 will send out the fault signal from the fault-out terminal FO to the fault-out terminals FO of the second driving IC 112 and the third driving IC 113 when the first driving IC 111 detects over-current through the current sensing terminal CS.

In another aspect, either of the first driving IC 111, the second driving IC 112 and the third driving IC 113 will send out the fault signal from the fault-out terminal FO to the fault-out terminals FO of the remaining driving ICs when the driving IC detects over temperature and/or under voltage.

By the above-mentioned arrangement, communications between the driving ICs as well as transmissions of fault signals between the driving ICs can be done without passing through the controller 30. Hence, the response time could be shorter compared to the prior arts.

The following will describe an exemplary operation of detection of the fault condition and communication between the driving ICs. In the present embodiment, the first driving IC 111 is provided with a sensor to detect over current, while the second driving IC 112 and the third driving IC 113 do not have such sensor.

Figure 3:
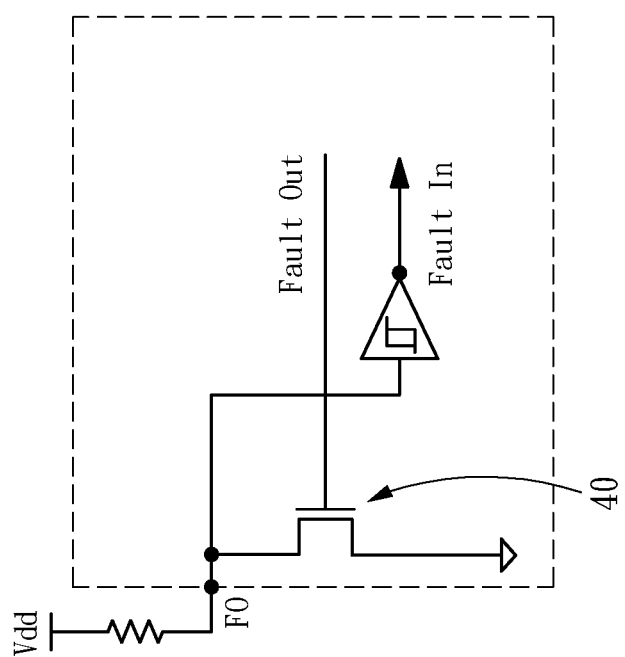
FIG. 3 illustrates a schematic diagram for fault out and fault in signals, in accordance with an example embodiment of the invention.

With reference to FIG. 3, in an exemplary embodiment, the fault-out terminal FO of the first driving IC 111 will be pulled down ("Fault Out" signal) when the sensor inside the first driving IC 111 detects over current through the current sensing terminal CS. Meanwhile, the first driving IC 111 will directly turn off the first pair of power switches 121 upon detecting the over current. In addition, a high signal (e.g. pull high) will be correspondingly generated to be acted as a "Fault In" signal. The example shown in FIG. 3 may implement a transistor 40 to trigger the Fault In signal.

For the second driving IC 112 and the third driving IC 113, they will detect that the fault-out terminal FO of the first driving IC 111 goes down and then also generate the Fault In signals. When the Fault In signal is generated in the second driving IC 112 (or the third driving IC 113), a component in the second driving IC 112 (or the third driving IC 113) will turn off the second pair of power switches 122 (or the third pair of power switches 123) to prevent failure of components.

Figure 1:
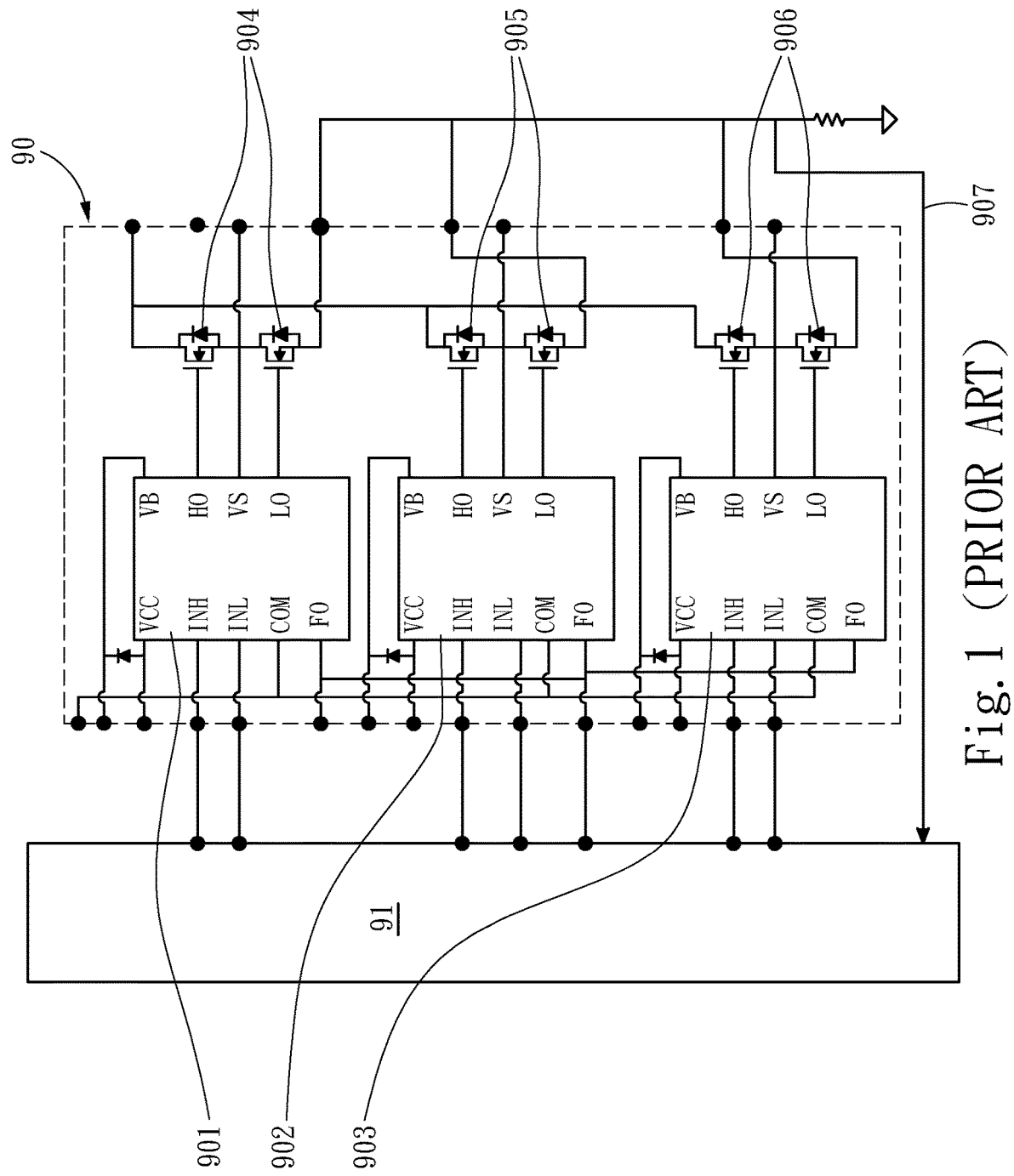
FIG. 1 illustrates a block diagram of a conventional semiconductor package according to an embodiment of the invention.
Figure 4:
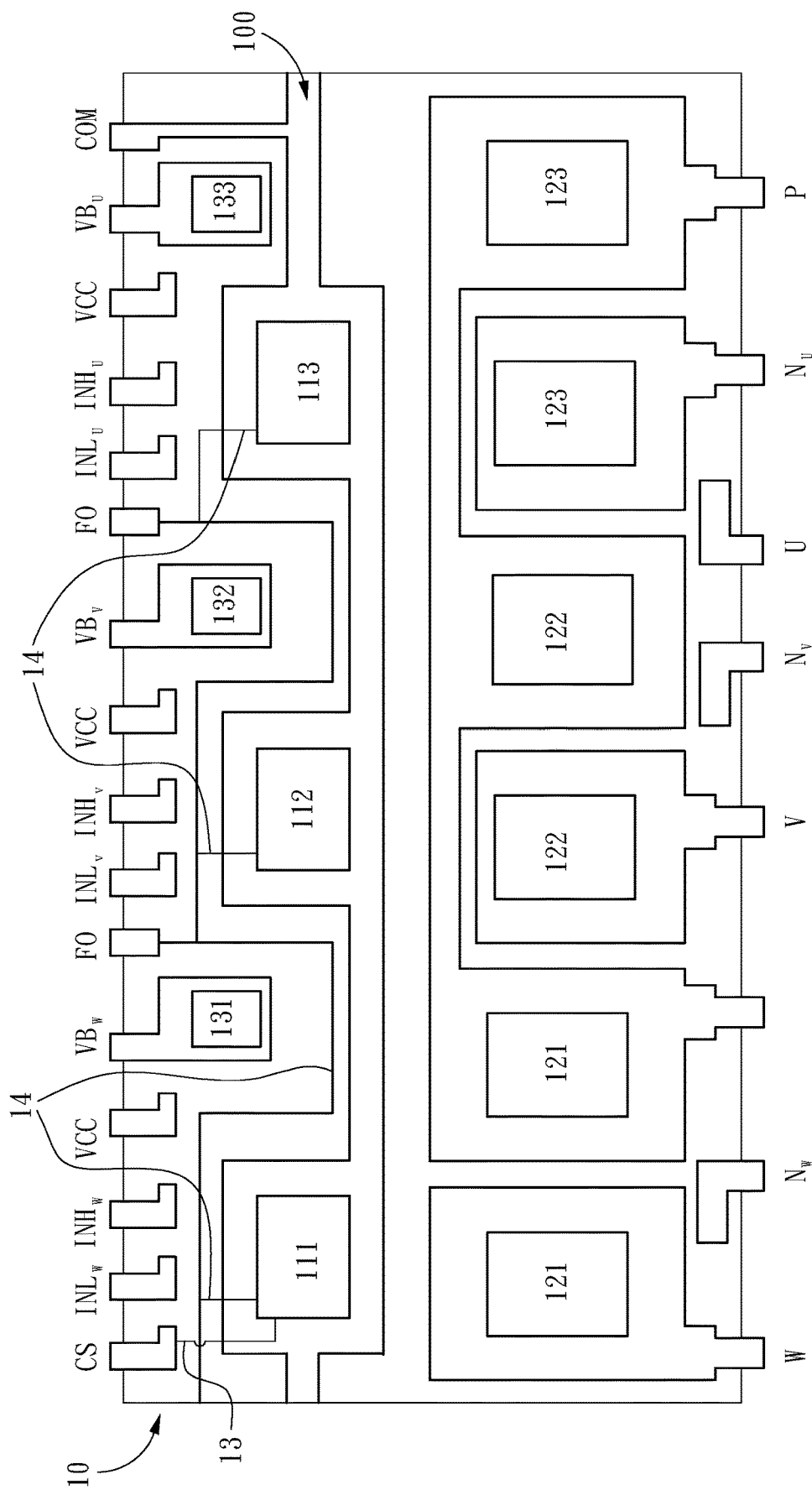
FIG. 4 illustrates a cross-sectional view of an exemplary semiconductor package according to an embodiment of the invention.

Referring now to FIG. 4 in detail, the semiconductor package 10 in DIP-23 package is shown which comprises an electrically conductive chip carrier 100, which is here embodied as a leadframe consisting of copper. In FIG. 4, some elements and connections are omitted for ease of viewing the shown elements. The semiconductor package 10 includes the first driving IC 111, the second driving IC 112, the third driving IC 113, the first pair of power switches 121, the second pair of power switches 122, the third pair of power switches 123, a first bootstrap diode (BSD) 131, a second bootstrap diode 132, a third bootstrap diode (BSD) 133, the first bonding wire 13 and the second bonding wire 14. The semiconductor package 10 further has 23 pins that corresponds to the pins in FIG. 1, where the relationships of the pins assignment in FIG. 2 and FIG. 4 are shown in Table 1.

TABLE 1

| Pin 1 | COM |
| Pin 2 | $VB_U$ |
| Pin 3 | VCC |
| Pin 4 | $INH_U$ |
| Pin 5 | $INL_U$ |
| Pin 6 | FO |
| Pin 7 | $VB_V$ |

TABLE 1-continued

| Pin 8 | VCC |
| Pin 9 | $INH_V$ |
| Pin 10 | $INL_V$ |
| Pin 11 | FO |
| Pin 12 | $VB_W$ |
| Pin 13 | VCC |
| Pin 14 | $INH_W$ |
| Pin 15 | $INL_W$ |
| Pin 16 | CS |
| Pin 17 | P |
| Pin 18 | $N_U$ |
| Pin 19 | U |
| Pin 20 | $N_V$ |
| Pin 21 | V |
| Pin 22 | $N_W$ |
| Pin 23 | W |

Although a DIP (dual in-line package) lead frame is described here, it is noted that any other type of lead frame or chip carrier may be used, including but not limited to DFN (dual flat no-leads), QFP (quad flat package), QFN (quad flat no-lead), QIP (quad in-line package), SOIC (small outline integrated circuit), and other leaded (e.g., leads extend beyond the package outline) or leadless (e.g., leads remain within package outline).

An advantageous feature of exemplary embodiments is a specific package design providing a shorter protection response time without adding additional pins on the package, thereby improving the performance as well as the reliability of the entire motor system.

While the present disclosure has been described and illustrated with reference to specific embodiments thereof, these descriptions and illustrations do not limit the present disclosure. It can be clearly understood by those skilled in the art that variations may be made, and equivalent elements and/or connections may be substituted within the embodiments without departing from the scope of the present disclosure as defined by the appended claims.

What is claimed is:

1. A semiconductor package for a multi-phase motor driving circuit, comprising:
    a driving unit, comprising a first driving IC and at least one second driving IC configured to couple with a controller;
    a switching unit, comprising a first pair of power switches coupling to the first driving IC and at least one second pair of power switches coupling to the second driving IC;
    a first bonding wire coupled directly between a sensing pin of the first driving IC and a connection between the driving unit and a motor driven by the driving unit; and
    a second bonding wire coupled between a fault out pin of the first driving IC and the second driving IC;
    wherein the driving unit, the switching unit, the first bonding wire and the second bonding wire are situated on a leadframe of the semiconductor package.

2. The semiconductor package according to claim 1, wherein the first pair of power switches and the second pair of power switches are configured to be turned off in response to a fault condition detected at the sensing pin of the first driving IC, wherein the fault condition is over current.

3. The semiconductor package according to claim 1, wherein the first driving IC is configured to:
    receive a detection signal at the sensing pin to determine that a fault condition occurred, wherein the detection signal is transmitted through the first bonding wire, wherein the fault condition is over current;

responsive to a determination that the fault condition occurred, generate a fault signal at the fault out pin; and
turn off the first pair of power switches coupled to the first driving IC.

4. The semiconductor package according to claim 3, wherein the fault signal is to pull down a voltage at the fault out pin of the first driving IC.

5. The semiconductor package according to claim 4, wherein the second driving IC is configured to:
sense the voltage at the fault out pin of the first driving IC through the second bonding wire; and
turn off the second pair of power switches coupled to the second driving IC.

6. The semiconductor package according to claim 1, wherein the first pair of power switches and the second pair of power switches are configured to be turned off in response to one or more fault conditions detected by either the first driving IC or the second driving IC, wherein the fault conditions are over temperature and under voltage.

7. The semiconductor package according to claim 1, wherein the first driving IC is configured to:
determine that one or more fault conditions occurred, wherein the fault conditions include one or more of: over temperature and under voltage;
responsive to a determination that the fault condition occurred, generate a fault signal at the fault out pin; and
turn off the first pair of power switches coupled to the first driving IC.

8. The semiconductor package according to claim 7, wherein the fault signal is to pull down a voltage at the fault out pin of the first driving IC.

9. The semiconductor package according to claim 8, wherein the second driving IC is configured to:
sense the voltage at the fault out pin of the first driving IC through the second bonding wire; and
turn off the second pair of power switches coupled to the second driving IC.

10. A semiconductor package for a three-phase motor driving circuit, comprising:
a driving unit, comprising a first driving IC, a second driving IC and a third driving IC, configured to couple with a controller;
a switching unit, comprising a first pair of power switches, a second pair of power switches and a third pair of power switches, configured to couple with the first driving IC, the second driving IC and the third driving IC, respectively;
a first bonding wire coupled directly between a sensing pin of the first driving IC and a connection between the driving unit and a motor driven by the driving unit;
an output pin of the first driving IC, the second driving IC and the third driving IC; and
a second bonding wire coupled between a fault out pin of the first driving IC, the second driving IC and the third driving IC;
wherein the driving unit, the switching unit, the first bonding wire and the second bonding wire are situated on a leadframe of the semiconductor package.

11. The semiconductor package according to claim 10, wherein the first pair of power switches, the second pair of power switches and the third pair of power switches are configured to be turned off in response to one or more fault conditions detected at the sensing pin of the first driving IC.

12. The semiconductor package according to claim 10, wherein the first pair of power switches, the second pair of power switches and the third pair of power switches are configured to be turned off in response to a fault condition detected at the sensing pin of the first driving IC, wherein the fault condition is over current.

13. The semiconductor package according to claim 10, wherein the first driving IC is configured to:
receive a detection signal at the sensing pin to determine that a fault condition occurred, wherein the detection signal is transmitted through the first bonding wire, wherein the fault condition is over current;
responsive to a determination that the fault condition occurred, generate a fault signal at the fault out pin; and
turn off the first pair of power switches coupled to the first driving IC.

14. The semiconductor package according to claim 13, wherein the fault signal is to pull down a voltage at the fault out pin of the first driving IC.

15. The semiconductor package according to claim 14, wherein the second driving IC is configured to:
sense the voltage at the fault out pin of the first driving IC through the second bonding wire; and
turn off the second pair of power switches coupled to the second driving IC.

16. The semiconductor package according to claim 10, wherein the first pair of power switches, the second pair of power switches and the third pair of power switches are configured to be turned off in response to one or more fault conditions detected by either the first driving IC, the second driving IC or the third driving IC, wherein the fault conditions are over temperature and under voltage.

17. The semiconductor package according to claim 10, wherein the first driving IC is configured to:
determine that one or more fault conditions occurred, wherein the fault conditions include one or more of: over temperature and under voltage;
responsive to a determination that the fault condition occurred, generate a fault signal at the fault out pin; and
turn off the first pair of power switches coupled to the first driving IC.

18. The semiconductor package according to claim 17, wherein the fault signal is to pull down a voltage at the fault out pin of the first driving IC.

19. The semiconductor package according to claim 18, wherein the second driving IC is configured to:
sense the voltage at the fault out pin of the first driving IC through the second bonding wire; and
turn off the second pair of power switches coupled to the second driving IC.

* * * * *